(12) United States Patent
Voβ

(10) Patent No.: US 9,778,320 B2
(45) Date of Patent: Oct. 3, 2017

(54) APPARATUS AND METHOD FOR MONITORING THE FUNCTION OF A SAFETY SWITCH MEANS

(71) Applicant: WAGO Verwaltungsgesellschaft mbH, Minden (DE)

(72) Inventor: Christian Voβ, Minden (DE)

(73) Assignee: WAGO VERWALTUNGSGESELLSCHAFT MBH, Minden (DE)

( * ) Notice: Subject to any disclaimer, the term of this patent is extended or adjusted under 35 U.S.C. 154(b) by 0 days.

(21) Appl. No.: 14/988,984

(22) Filed: Jan. 6, 2016

(65) Prior Publication Data
US 2016/0195582 A1   Jul. 7, 2016

(30) Foreign Application Priority Data
Jan. 7, 2015   (DE) .................. 10 2015 200 057

(51) Int. Cl.
*G01R 31/327* (2006.01)
*G05B 9/02* (2006.01)
*G05B 19/042* (2006.01)

(52) U.S. Cl.
CPC .......... *G01R 31/3278* (2013.01); *G05B 9/02* (2013.01); *G05B 19/0425* (2013.01); *G05B 2219/1185* (2013.01)

(58) Field of Classification Search
CPC ................. G05B 9/02; G05B 19/0425; G05B 2219/1185; G05B 2219/1108
See application file for complete search history.

(56) References Cited

U.S. PATENT DOCUMENTS

| | | | |
|---|---|---|---|
| 2008/0007879 A1 | 1/2008 | Zaretsky et al. | |
| 2009/0212975 A1* | 8/2009 | Ausman ............ | G01R 31/3277 340/945 |
| 2010/0045327 A1* | 2/2010 | Chen .................. | G01R 31/3277 324/750.3 |
| 2013/0214805 A1* | 8/2013 | Saloio, Jr. ............. | H02H 3/044 324/750.01 |
| 2015/0062987 A1* | 3/2015 | Chen ...................... | H02M 1/32 363/89 |
| 2015/0198666 A1* | 7/2015 | Edwards ................ | H03K 17/18 324/415 |

FOREIGN PATENT DOCUMENTS

| | | |
|---|---|---|
| DE | 195 08 841 A1 | 9/1996 |
| EP | 2 149 826 A1 | 2/2010 |
| WO | 02/071600 A2 | 9/2002 |

OTHER PUBLICATIONS

European Search Report dated May 10, 2016 for corresponding application No. 15200414.9.

* cited by examiner

*Primary Examiner* — Son Le
*Assistant Examiner* — Dustin Dickinson
(74) *Attorney, Agent, or Firm* — Renner, Otto, Boisselle & Sklar, LLP.

(57) ABSTRACT

An apparatus and a method are provided for monitoring the function of a safety switch means, wherein the safety switch means in particular can be used to switch an actuator. The apparatus and method enable the function of a safety switch means to be reliably monitored in a cost-effective manner. Further, the apparatus and method can provide universal function monitoring.

15 Claims, 7 Drawing Sheets

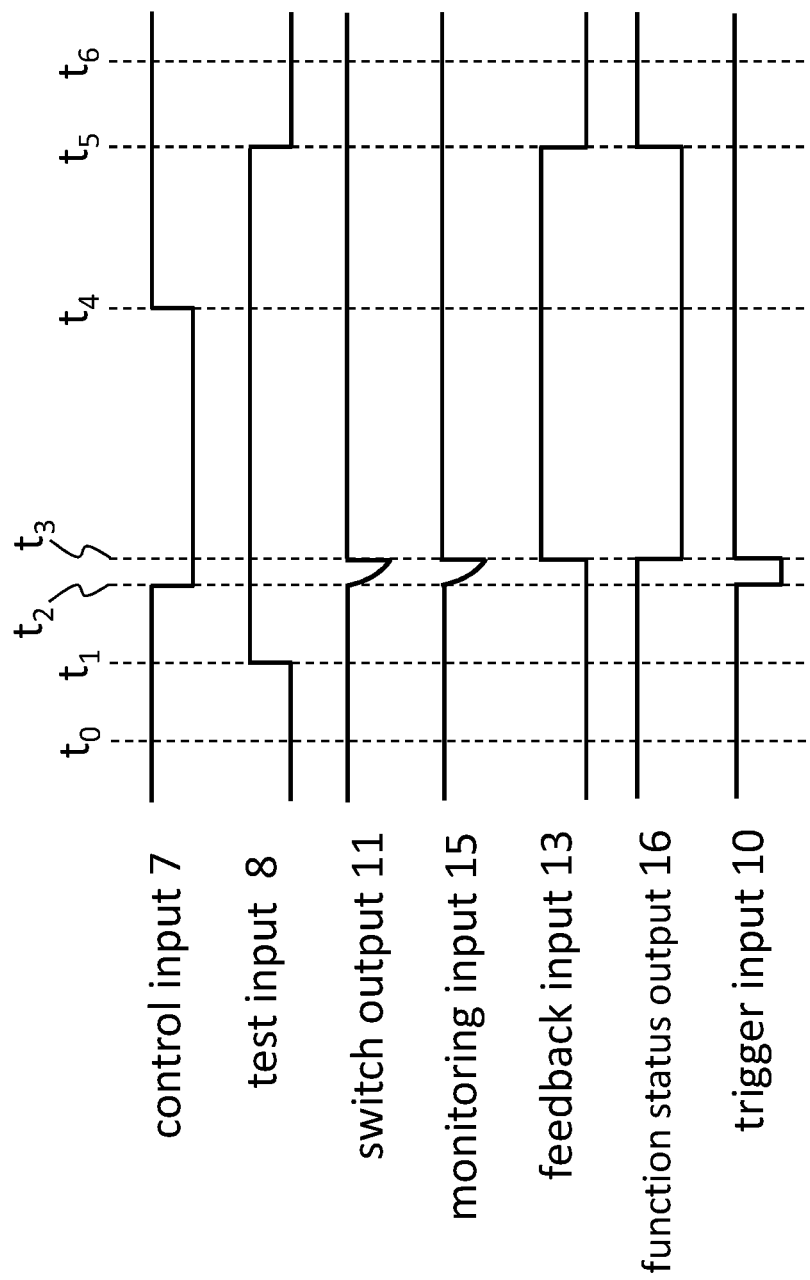

APPARATUS AND METHOD FOR MONITORING THE FUNCTION OF A SAFETY SWITCH MEANS

Figure 1:
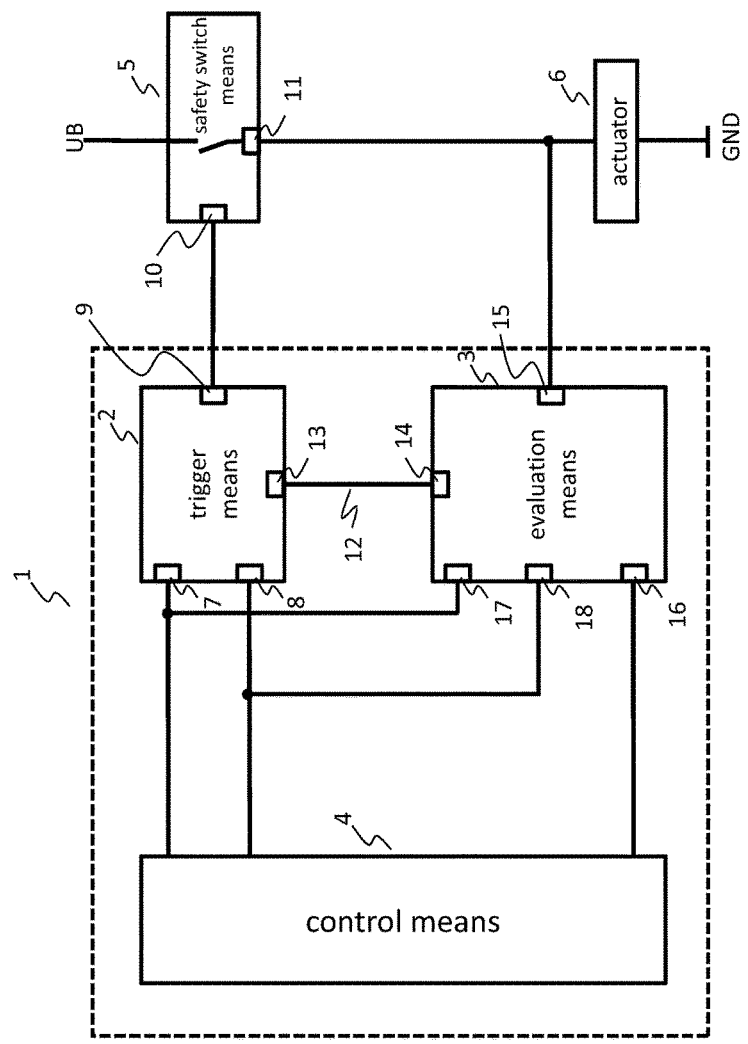

This application claims priority of German Application No. 10 2015 200 057.5 filed Jan. 7, 2015, which is hereby incorporated herein by reference.

1. FIELD OF THE INVENTION

The present invention relates to an apparatus and a method for monitoring the function of a safety switch means, wherein the safety switch means in particular can be used to switch and actuator.

2. BACKGROUND

Safety circuits with safety switch means are used for switching safety-relevant actuators, as for example a drive motor, which is switched via a motor contactor. For monitoring the operating status of the actuator safety circuits may use feedback signals of the actuator, for example via an auxiliary contact of the contactor. In case of a failure, if the current switching signal does not coincide with the feedback signal, such a safety circuit causes the actuator to be disconnected from the grid by ease of the safety switch means. Depending on the required security level safety circuits can also be configured redundantly.

The operability of the safety switching means has thereby to be ensured at any time. Preferably semiconductor switches are used as safety switch means, since then the use of metal contacts can be avoided, which may wear out, oxidize, or even stick together. For testing the function capability of the safety switch means, the switching status is changed in regular intervals, in order to check the proper switching of the safety switch means. After the proper functioning of the safety switch means is assessed, the change of the switching status of the safety switch means is reversed. The time interval between the two switching operations should be relatively short. In any case, the time interval should be short enough so that due to the inertia of the actuator, the operating status of the actuator is not changed in order to prevent accidental switch off of the actuator.

In the prior art, the monitoring of the function of the safety switch means is tested by ease of a programmable logic. For this purpose, a test signal is generated by the programmable logic that changes the switching status of the safety switch means. After the successful detection of the switching via a monitoring input, the programmable logic switches the safety switch means on again.

As described for example in DE 195 08 841 A1, a computing unit can change the switching status of the safety switch means for the length of a test pulse. The length of the test pulse ideally is adapted by the inertia of the actuator to be switched, so that the operating status of the actuator during the test will not be changed. The successful change of the switching status is displayed during the test at an input of the computing unit.

In EP 2 149 826 B1 the function monitoring is described by ease of a programmable logic, wherein the programmable logic enables a simple adaptation of the function monitoring of the safety switch means to be tested and the actuator used.

However, such function monitoring have the disadvantage that the programmable logics used, such as micro controllers or computational units must be sufficiently fast to recognize the successful change of the switching status at the corresponding input of the programmable logic, since the associated signal is there only present for a short duration of time. Therefore, only very high clocked programmable logics can be used for the function monitoring, as only these programmable logics meet the speed requirements. However, such programmable logics are comparatively expensive. Furthermore, such monitoring function have the disadvantage that the switching time depends on the speed and software architecture of the programmable logic and the duration of the test signal respectively the test pulse which may need to be adjusted manually to the inertia of the component to be switched.

The object of the present invention is therefore to provide an apparatus for monitoring the function of a safety switch means that is inexpensive to manufacture, is independent of the speed of the programmable logic and which independent of the inertia of the component to be switched provides a reliable result.

3. SUMMARY OF THE INVENTION

This object is achieved by the apparatus for monitoring the function according to claim 1 and the method for monitoring the function according to claim 15.

The apparatus according to the invention is used for monitoring the function of a safety switch means, which in particular can be used to switch an actuator. Such a safety switch means comprises a trigger input and a switching output. The apparatus according to the invention comprises a trigger means and an evaluation means. The trigger means comprises, a control input, a test input, a feedback input and a trigger output for connecting to a trigger input of the safety switch means. The evaluation means comprises a monitoring input for connecting to a switching output of the safety switch means, a function status output and a feedback output. The trigger means is adapted to change a signal at the trigger output depending upon signals on the test input and the control input for a function test of the safety switch means. The evaluation means is adapted to detect a change of a signal at the switching output of the safety switch means via the monitoring input and in particular during a function test to forward a signal with an information regarding the change via the feedback output of the evaluation means to the feedback input of the trigger means and to provide a signal with an information regarding the change at the function status output. Furthermore, the trigger means is adapted to immediately reverse the signal change at the trigger output, when during a function test a signal with an information regarding the change of the signal at the switching output of the safety switch means is received.

By ease of the apparatus according to the invention the function of safety switch means can for the first time be monitored reliably and afford less. Moreover, the apparatus according to the invention provides for the first time a universal function monitoring because the apparatus can be used regardless of the component to be switched.

The device of the invention will be described by way of example in context of a safety switch means for switching an actuator. But the same advantages can be achieved even when switching other elements.

Such safety switching means comprises a trigger input and a switching output. The trigger input is the input of the safety switch means via which the safety switch means receives a signal with the information that it has to switch. In context of the present invention, a signal describes something with which information can be conveyed. The information can be conveyed for example by an analog or a digital signal. The information may also be conveyed by the fact that either a signal or no signal is conveyed. The switching status of the safety switch means affects the switching output of the safety switch means. For example, the safety switch means may comprise a further input to which an operating voltage is applied. Depending upon the switching status of the safety switch means this operating voltage is applied to the switching output and thus to the actuator connected to the switching output or not.

The trigger means of the apparatus according to the invention comprises a test input. This is to provide an input via which the trigger means receives a signal with information about or for the function testing. A signal applied to this input can indicate, for example, that with a falling edge at the control input, a function test has to be performed. The trigger means also includes a trigger output. This trigger output is during the function monitoring linked with the trigger input of the safety switch means. By ease of a signal provided via the trigger output, the safety switch means is operable, i.e. it can be switched. In addition, the trigger means comprises a feedback input, which is explained further below.

As part of the function monitoring a signal at the trigger output can be changed by ease of the trigger means of the apparatus according to the invention. The purpose of this signal change is to change the switching status of the safety switch means for a function test, wherein the safety switch means is connected by its trigger input to the trigger output of the trigger means. According to the invention the trigger means changes the signal at the trigger output dependent upon a change of the signals at the control input and the test input. As already explained above, the signal at the test input may for example be indicating the execution of a function test. For example, the signal is first changed at the test input in preparation for the test. Thereafter, the test is initiated by a change of the signal at the control input.

An example of the change of a signal is a change from a logic low level to a logic high level or vice versa. The low level can also be referred to as a logical "0" signal and the high level as a logical "1" signal. In principle, however, each signal change is encompassed that can be recognized by the receiver as a change. In particular, signal changes are encompassed by which the information conveyed by the signal changes.

The evaluation means according to the apparatus of the invention comprises a monitoring input for connecting to the switching output of the safety switch means. Furthermore, the evaluation means comprises a function status output and a feedback output.

The monitoring input of the evaluation means detects a change of a signal at the switching output of the safety switch means. Therefore, the monitoring input can for example be connected to the link between the safety switch means and the actuator.

The feedback output of the evaluation means is connected via a feedback link with the feedback input of the trigger means. In context of the invention the evaluation means provides the trigger means via this link with a signal with an information regarding the change of a signal at the switching output of the safety means. This has the advantage that the trigger means immediately after detecting a change in the switching status of the safety switch means can again change the switching status. The signal with the information regarding the change of the signal at the switching output of the safety switch means can be conveyed in various different ways to the feedback input of the trigger means. Preferably, a signal is changed at the feedback input of the trigger means, when a change of the signal at the switching output of the safety switch means is detected.

By ease of the function status output, the evaluation means also provides a signal with an information regarding the change of the signal at the switching output. Thereby, this can for example be an indication that the safety switch means functions properly. This signal with such kind of information can also be forwarded to other means, as described below.

In principle, the safety switch means may switch the power supply input of the actuator to the positive supply voltage and/or the power supply output of the actuator to ground. In a preferred embodiment, the safety switch means switch the actuator to both the positive supply voltage and to the ground. For example, the function monitoring according to the invention may be configured redundantly, i.e. by ease of two safety switches an actuator is connected to the supply voltage and to ground, as is required for example in the standard EN ISO 13849 for safety switching arrangements of the highest security level.

In a further preferred embodiment the safety switch means is a semiconductor switch. Semiconductor switches unlike mechanical relays have no mechanical contacts and faster switching times. Furthermore, semiconductor switches are subject to less aging than comparable switches with mechanical contacts. In context of the present invention, however, a relay could also be used as a safety switch means, for example if the use of a relay is prescribed by a standard for the function monitoring of the safety switch means.

In a preferred embodiment the trigger means is adapted to change the signal at the trigger output as long as the signal at the test input and the signal at the feedback input of the trigger means do not change. By changing the signal at the trigger output the status of the safety switch means is changed. To ensure that this changed status of the safety switch means is long enough for the function test, the status will only be changed when by ease of the feedback input a successful function test is reported or function test is terminated by the test input. By this simple logical condition, the time of a test switch off can be minimized. After the evaluation means recognizes a switch off of the safety switch means, the evaluation means changes the signal on the feedback link. By the change of the signal, the change of the signal at the trigger output of the trigger means is reversed and thus, for example, the safety switch means is switched on again.

Therefore, the trigger means switches the safety switch means back on, before the switching status of the actuator can change. Advantageously, by ease of the short test switch off respectively the short change of the switching status of the safety switch means, it is ensured that the switching status of the actuator does not change. This is the case because the actuator generally has a certain inertia. This inertia is produced for example by the moving parts of a mechanical relay and by the self-induction of a coil used.

In yet another preferred embodiment, the signal with the information about the change of the signal at the switching output is provided at the function status output at least as long as a signal at the test input of the evaluation means is present. Therefore, the evaluation means in a preferred embodiment comprises also a test input, for example, the test input may be connected to the test input of the trigger means. This has the advantage that the evaluation means can provide the detected change of switching status to the function status output also after the switching status of the safety switch means has changed again. This saving provision has the advantage that the success of the test switch off is reported for function monitoring by ease of a signal to the function status output of the evaluation means, even if the switching status of the safety switch means has been changed again by the trigger means after a successful test switch off. This makes it possible to interrupt the operating voltage of the actuator for only a very short time, regardless of the duration of a test signal. Thus, the duration of the test signal may be longer than the inertia of the coil, such that for example a slow programmable logic, as for example a slow micro controller can detect the change of the switching status of the function status output. A further advantage is that the adaptation of the test pulse duration to the inertia of the actuator, for example, to the inertia of a coil can be omitted.

In a further preferred embodiment, the trigger means is adapted to change the signal at the switching output of the safety switch means in response to a signal at the control input. By ease of the signals at the control input, the safety switch means can be switched, for example, in a so-called operational mode. With operational mode a mode is meant in which the safety switch means is willingly and switched for a longer period of time and not for the function test. In that this signal is provided to the trigger means, the switching of the safety switch means can always be carried out by ease of the trigger means, i.e. regardless of whether a function test is carried out, or whether the switch should take place in the operational mode. In addition, the signal with the information regarding the signal at the control input can also be helpful for carrying out the function test. For example, the trigger means can avoid performing a function test, if it appears from the signal at the control input that the safety switch means being switched in the operational mode.

In yet another preferred embodiment, the evaluation means has a control input and is adapted to reset a signal at the feedback output and the function status output in case of receiving a signal with an information regarding the actual switching status change of the safety switch means as reaction to a signal at the control input. For example, this is done by changing the signals present at the respective outputs. This enables a connected device, such as a control means, to distinguish between a regular switch off by a signal at the control input and a test switch off via a signal at the test input.

In yet another preferred embodiment, the functions performed by the trigger means and the evaluation means in the respective embodiments are realized with hardwired logic. This allows an immediate switch on in case of a successful function testing of the safety switch means without the need to use expensive hardware components. In particular, by a separation of the elements that cause the switching on from the elements that start the function test and process the result, the use of low-cost programmable logic, such as low-cost micro controllers is possible without affecting the operation of the actuator.

In a further preferred embodiment, the trigger means is implemented using logic gates and the evaluation means is implemented by bi-stable latch circuits. The evaluation means comprises at least one bi-stable latch circuit, for example, a flip-flop. By ease the bi-stable latch circuits, for example, a signal with information regarding the change of the signal at the switching output can be provided for a longer period of time, even if the associated switching status of the safety switch means has changed again in the meantime.

The logic gates in the trigger means, such as an AND gate and an OR gate have the advantage that the delay of a logic, which is constructed solely of such logic gates, is very low and thus a very fast switch on after a test switch off is possible. In fact, delays are only caused by the different signal propagation times and by the different reaction times of the various logic gates. These delays are only in the range of nanoseconds and can be neglected in practice for the majority of applications.

In yet another preferred embodiment, the apparatus for monitoring the function also comprises a control means which is connected to the test input of the trigger means and the function status output of the evaluation means. This enables controlling of the function test and evaluating the results obtained therefrom by the control means. In a preferred embodiment, the control means is also connected to the control input of the trigger means. This allows the complete switching of the safety switch means to be carried out by the control means, regardless of whether this switching takes place in the operational mode or during a function test.

In a preferred embodiment, the control means is adapted to initiate a function test at periodic intervals. By ease of such periodic tests, it can be ensured that a possible failure is detected quickly. In a preferred embodiment, the control means initiate the function test by changing the signals at the test input and the control input of the trigger means. Thus, the conditions for performing the function test can be easily changed. Preferably, the periodic interval at which the function test is initiated is in a range of 5 milliseconds to 15 minutes. Basically, the periodic interval may have any length, which for example are prescribed by the relevant standards for different applications, or an interval that the developer seems appropriate. The length of the test pulse can for example be 50 to 100 microseconds, however, also be shorter or longer depending on the application. Alternatively, the test pulse can be longer, because after a successful test switch off, the safety switch means is immediately switched on again, regardless of the duration of the test pulse.

In a further preferred embodiment, the control means comprises a programmable logic such as a micro controller. By means of such programmable logic, the periodic interval and the length of the test pulse, but also different interval times or pulse widths can be easily implemented and the control of further components, such as, for example, further safety switch means in the circuit can be carried out.

The method according to the invention for monitoring the function of a safety switching means, which can be used in particular for switching an actuator, comprises the following steps: changing a signal at a trigger output of a trigger means which is connected to a trigger input of the safety switch means, depending upon a signal at a test input and a control input of the trigger means, detecting at an evaluation means a change of a signal at a switching output of the safety switch means, providing at a function status output of the evaluation means a signal with an information regarding the change of the signal at the switching output of the safety switch means and forwarding the signal with information regarding the change to a feedback input of the trigger means, and resetting the signal change at the trigger output of the trigger means during a function test depending upon the reception of the signal with the information regarding the change.

4. BRIEF DESCRIPTION OF THE FIGURES

Figure 2:
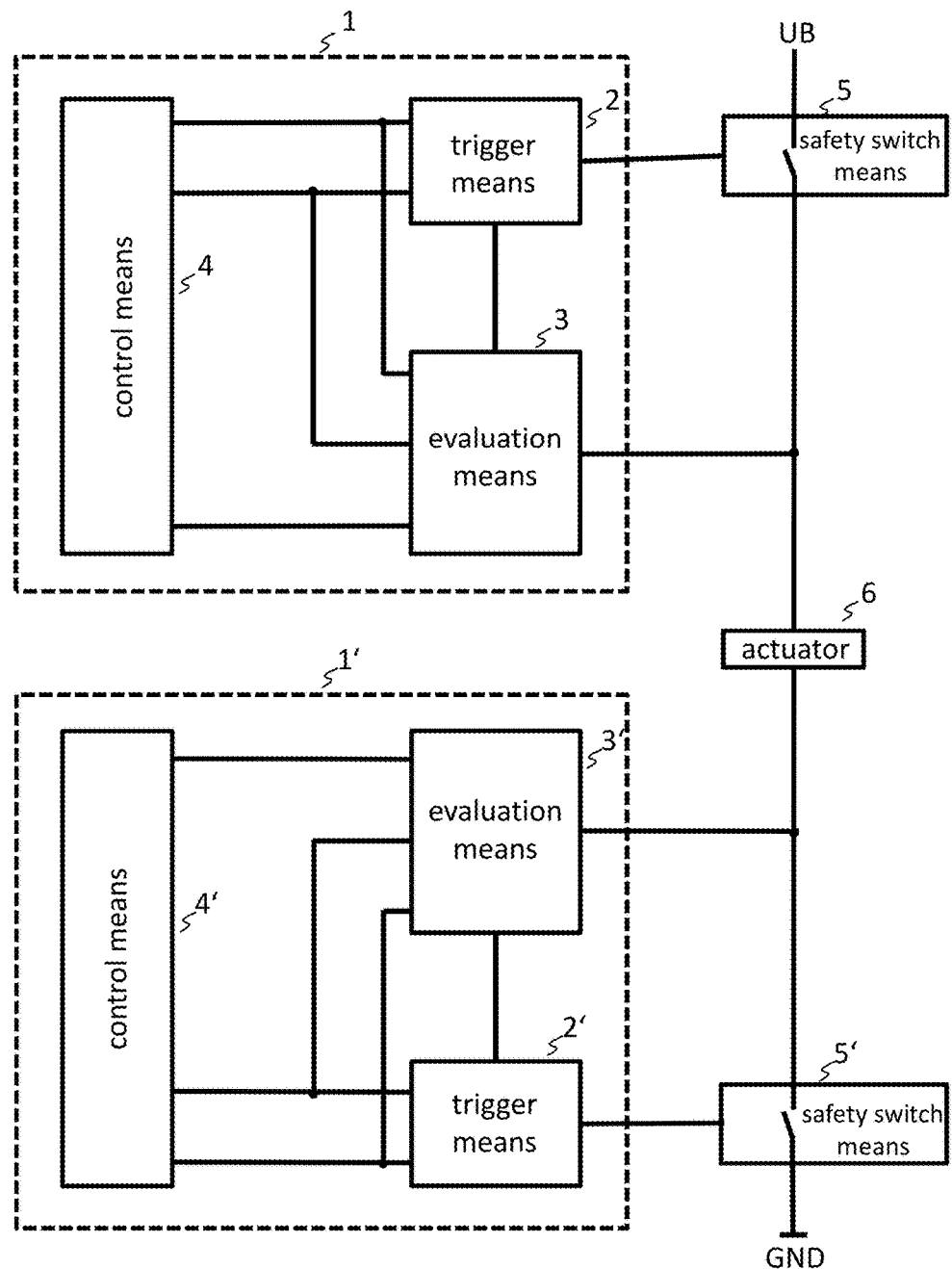
Figure 3:
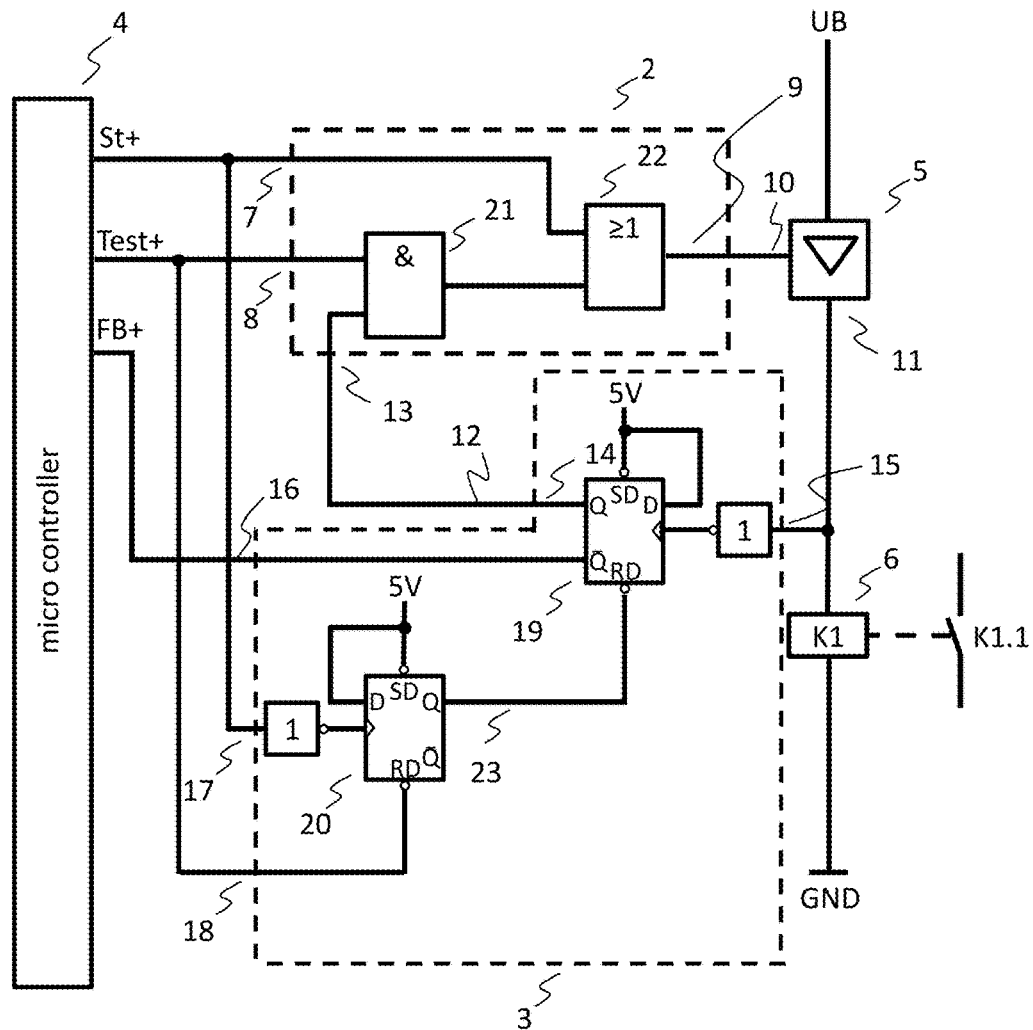
Figure 4A:
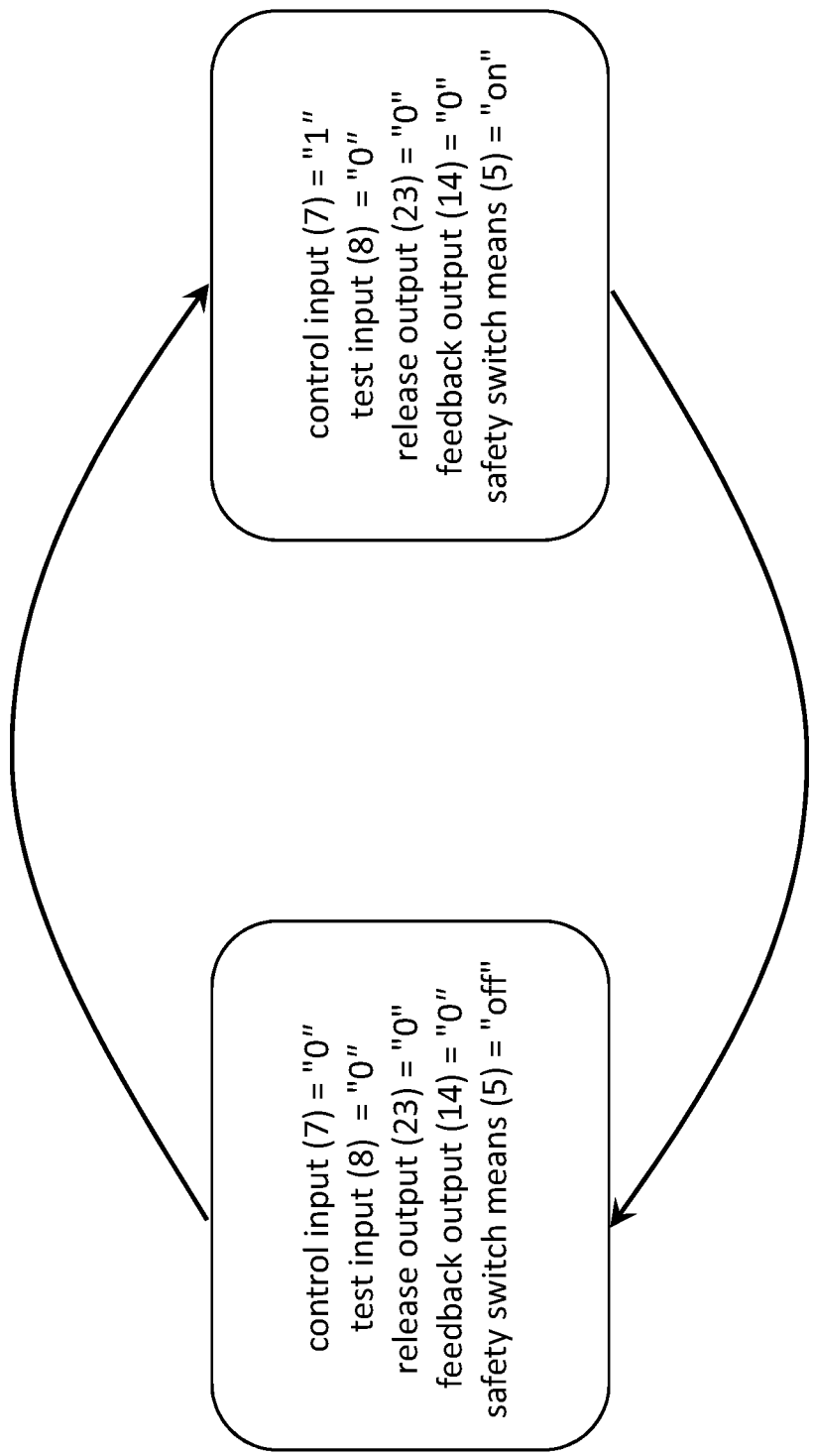
Figure 4B:
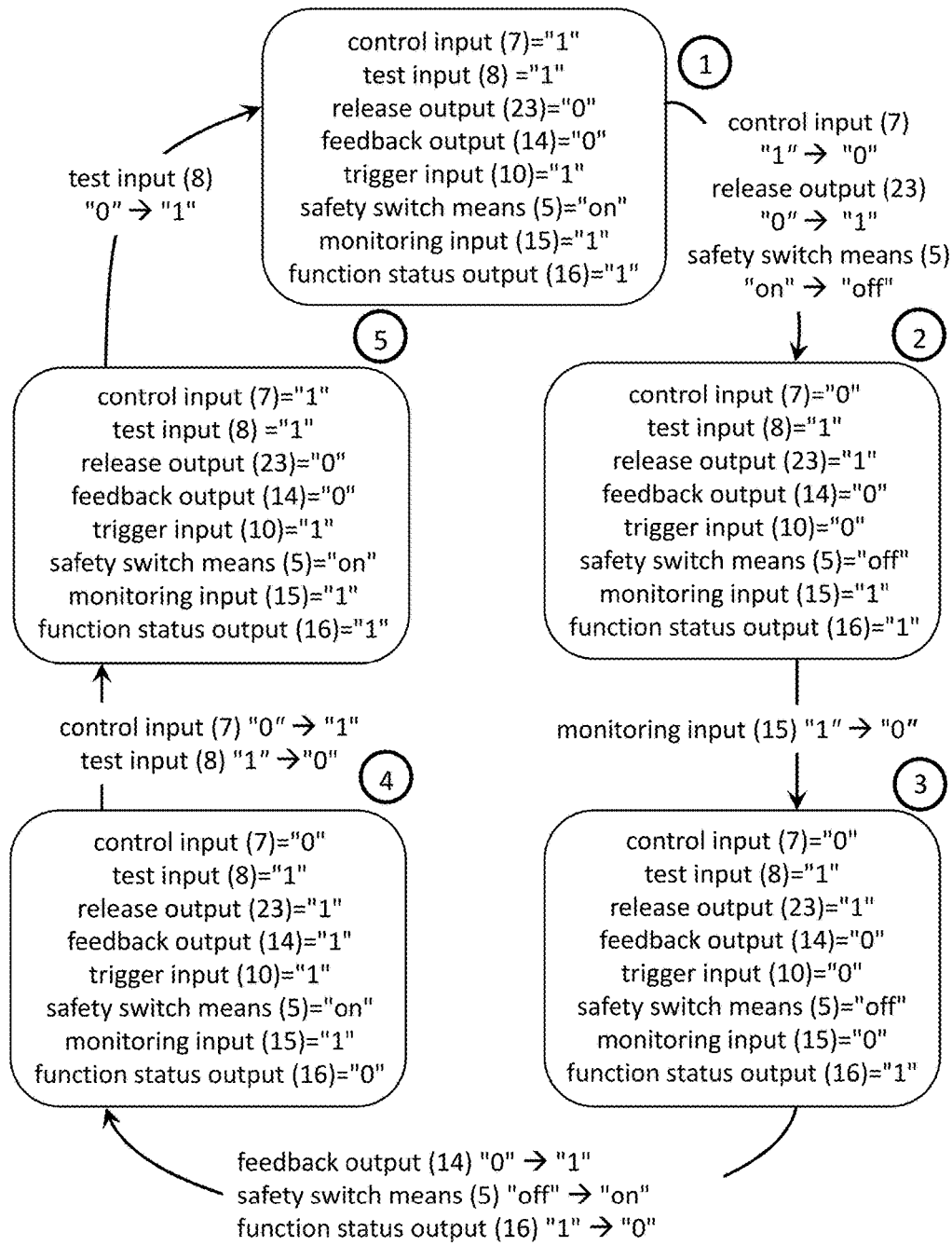
Figure 4C:
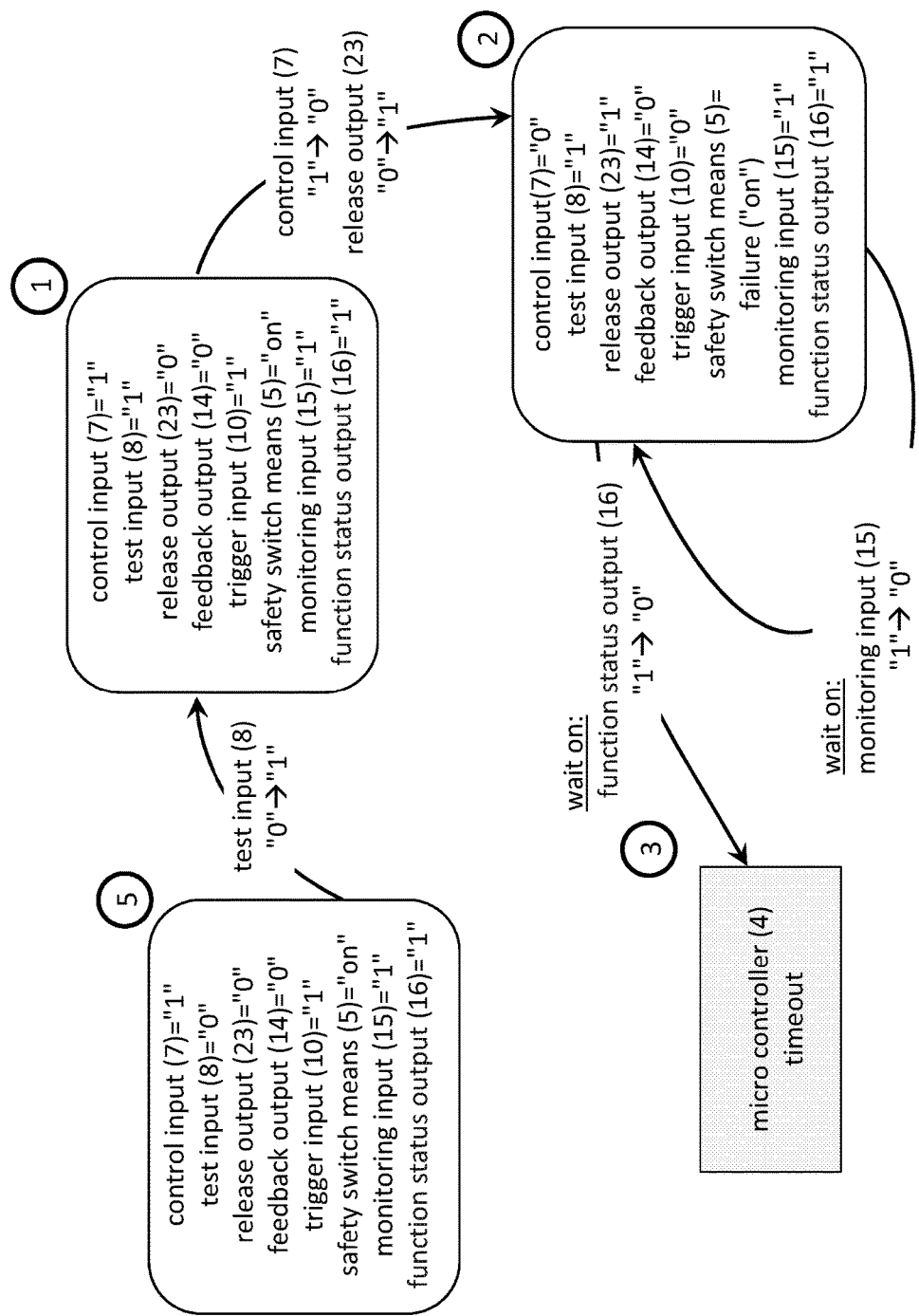

In the following, the apparatus and the method for monitoring the function according to the invention will be explained in detail with reference to the embodiment shown in the following figures. Shown are:

FIG. 1: a block diagram of an exemplary embodiment of the apparatus according to the invention for function monitoring in a singular design, FIG. 2: a block diagram of an exemplary embodiment of the apparatus according to the invention for function monitoring in a redundant design, FIG. 3: a simplified circuit diagram of an apparatus for function monitoring according to the invention in which the trigger means and the evaluation means are implemented in hardwired logic, FIG. 4a, 4b, 4c state diagrams for the control of the apparatus according to the invention for function monitoring, during a simple on and off of the safety switch means and with a faultless and faulty safety switch means, and FIG. 5: a timing diagram of the apparatus according to the invention for function monitoring during a function test.

5. DETAILED DESCRIPTION OF THE EMBODIMENTS

FIG. 1 shows a block diagram of an exemplary embodiment of the apparatus 1 according to the invention for monitoring the function in a singular design. FIG. 1 also shows a safety switch means 5 with which an actuator 6 is switched. For this purpose, the safety switch means 5 comprises a trigger input 10 and a switching output 11, which are linked to the actuator 6. By ease of the apparatus 1 according to the invention, the operation of the safety switch means 5 is to be monitored.

The embodiment shown in FIG. 1 of the apparatus 1 for monitoring the function comprises a trigger means 2 and an evaluation means 3. The trigger means 2 is connected via a trigger output 9 to the trigger input 10 of the safety switch means 5. The trigger means 2 serves to emit a signal via the trigger output 9 to the safety switch means 5. By ease of this signal, the safety switch means 5 is switched, if the safety switch means 5 is working properly. Therefore, this signal is also referred to as a switching signal.

In the operational mode, the trigger means 2, for example, can provide the switching signal in response to a signal at the control input 7 of the trigger means 2. In the embodiment shown in FIG. 1, the apparatus 1 comprises for monitoring the function a control means 4, which is connected via the control input 7 of the trigger means 2 with the trigger means 2. In the operational mode, the control means 4 can for example emit a signal at the control input 7, which causes the trigger means 2 to change the signal at the trigger output 9 as such that the safety means 5 is switched, for example in response to a detected actuator failure, for example welded relay contacts, in order to open the safety switch means 5 and thus to separate the actuator 6 from the power supply.

Furthermore, the trigger means 2 comprises a test input 8. Via the test input 8, the trigger means 2 receives the signal with the information that a function test is to be performed. In the embodiment shown, this is done by a signal at the test input and a simultaneous removal of the signal at the control input. In the embodiment shown in FIG. 1, the test input 8 of the trigger means 2 is connected to the control means 4. Through this link, the control means 4 controls performing function testing of the safety switch means 5. Via the test input 8 function tests of the safety switch means 5 can be initiated cyclically or at irregular intervals. During a function test, the trigger means 2 can switch on and again switch off the safety switch means 5 depending on the received test signal.

The evaluation means 3 ensures as part of the function test that the function test is completed as soon as possible, and the operational mode is continued. For this purpose, the evaluation means 3 comprises a monitoring input 15 which is connected to the switching output 11 of the safety switch means 5. By ease of this monitoring input 15, the evaluation means 3 is provided with the signal with information regarding a change in a signal at the switching output 11 of the safety switch means 5. Depending upon the signal at the monitoring input 15, the evaluation means 3 changes the signals at the feedback output 14 and at the function status output 16.

The signal with the information regarding the change of the signal at the switching output and thus with regards to the switching status of the safety switch means 5 is provided to the trigger means 2 by the evaluation means 3 via a feedback link 12. Because of this signal with this information, the trigger means 2 can immediately reverse the change of the signal at the trigger output 9 and thus switch the safety switch means 5 on again before the function test has been completed by the end of the test signal.

In the present embodiment, the signal with the information regarding the switching status of the safety switch means 5 is provided to control means 4 via a function status output 16 of the evaluation means 3. In the present embodiment, this signal is provided with this information, regardless of whether the safety switch means 5 has been switched on again or not.

In the present embodiment, the evaluation means 3 also comprises a control input 17 and a test input 18. Thus, the evaluation means 3 is able to distinguish between a function test switch off or a deliberate switch off of the safety switch means 5. However, the provision of the control input 17 and the test input 18 is only one possible implementation. There are also solutions in which only one of the two inputs are necessary. In addition, this function can for example also be achieved in that the trigger means 2 is switched, such that only if the test function is indicated at the test input 8, the feedback signal has an effect on the feedback output 9.

The safety switch means 5 can be an electronic semiconductor switch. Alternatively, the safety switch means 5 may also be formed of a mechanical relay.

In the embodiment shown, the operating voltage of the actuator 6 and the operating voltage of the apparatus 1 for monitoring the function is the same. Alternatively, the actuator 6 and the apparatus 1 for monitoring the function have different operating voltages. For example, the switched operating voltage for the actuator 6 may be higher than the voltage of the apparatus 1 for monitoring the function. In this case (not shown in the figures) in addition in front of the monitoring input 15 of the evaluation means 3 a means for reducing the voltage can be arranged. This means could be, for example, formed by a voltage divider circuit or a transformer with or without voltage rectifier.

FIG. 2 shows an embodiment of the apparatus 1 according to the invention for monitoring the function in a redundant design. For achieving the highest level of security, the safety switch means 5, as well as the connected apparatus 1 for monitoring the function is present in pairs. In addition, the control means 4 can also be configured redundantly.

In the embodiment shown in FIG. 2, there are two safety switch means 5, 5' in the current path of an actuator 6. The first safety switch means 5 switches the actuator 6 against the positive supply voltage UB, the second safety switching means 5' switches the actuator 6 against the ground, GND.

FIG. 3 shows a realization of the trigger means 2 and evaluation means 3 as shown in FIGS. 1 and 2 by means of hardwired logical components.

In the embodiment shown in FIG. 3, the trigger means 2 is formed by an AND gate 21 and an OR gate 22, each having two inputs. The control input 7 of the trigger means 2 is connected to the OR gate 22 so that an "1" signal at the control input 7 triggers the safety switch means 5. At the second input of the OR gate 22 the output of the AND gate 21 is connected. As shown in FIG. 3, the AND gate 21 associates the signal at the test input 8 with the feedback input 13 of the trigger means 2. As will become more apparent in the following description of the timing diagram of FIG. 5 with the example shown, this AND operation causes that after a switch off in context of a function test of the safety switch means 5, the safety switch means 5 is immediately switched on. This is done here by the simultaneous presence of a signal at the test input 8 and at the feedback input 13 of the trigger means 2.

The signal at the feedback input 13 of the trigger means 2 is provided from the evaluation means 3. The function of the evaluation means 3 is to detect a switch off in the context of a function test and to indicate this to the control means 4 via a signal at the function status output 16 and to the trigger means 2 via a signal at the feedback input 13.

In the embodiment shown, the evaluation means 3 is realized with two edge-triggered D flip-flops 19, 20. As shown in FIG. 4b, the flip-flops 19, 20 are connected such that a signal change at the control input 7, and at the test input 8, initializes the flip-flops 19, 20, i.e. the signals at the release output 23 of the flip-flop 19 and at the feedback output 14 of the flip-flop 20 are set to "0", so that they respond to "edges", which are caused by the following test procedure. A switch off due to a function test is thus registered as a signal change from "1" to "0", or from "0" to "1" by negation of the monitoring input 15 by the flip-flop 19. The edge-triggered flip-flop 19 then changes the switching status of its outputs, so that the signal at the feedback output 14 is set from "0" to "1", in order to signal to the trigger means 2, the successful switch off. At the same time, the signal on the function status output 16 which is connected to the control means 4 also changes, wherein the control means 4 is here shown as a micro controller. The signal at the function status output 16 is provided in a storing manner to the micro controller. This means that the signal is still indicated after switching on the safety switch means 5 and after the signal change at the control input 17 is indicated. By the subsequent change of the signal at the test input 18 of the flip-flops 19, 20 they are brought back into the condition prior to the function test.

FIG. 4a shows a state diagram for the control of the apparatus according to the invention for function monitoring, in the embodiment as shown in FIG. 3 in the faultless operational state. To illustrate the basic function of the apparatus for monitoring it is shown here that a signal at the control input 7 of the trigger means 2 switches on the safety switch means 5 and at the same time that the removal of this signal at the control input 7 of the trigger means switches off the safety switch means 5. The signals at the release output 23 and at the feedback output 14 of the flip-flops 19, 20 shown in FIG. 3 do not change.

In FIG. 4b a state diagram for the control of the apparatus according to the invention for function monitoring shows the implementation of a function test with restart and with a faultless safety switch means using the embodiment as shown in FIG. 3.

First, for the execution of the function test, as shown at node 1, the test input 8 of the trigger means 2 is set to "1", while the control input 7 is still set to "1", such that the safety switch means 5 is kept in a switched on state. However, this signal change on the test input 8 does not yet cause the safety switch means 5 to be switched off.

As is shown at node 2, the actual function test is performed by removing the signal at the control input 7, i.e. carried out by a change from "1" to "0". This change in signal causes the safety switch means 5 to be switched off. Therefore, also the trigger input 10 of the safety switch means 5 is set to "0", as shown at node 3.

Due to the signal change at the monitoring input 15 of the evaluation means 3, caused by the switching off of the safety switch means 5, the flip-flop 19 is set, which in turn causes a signal change from "0" to "1" at the feedback input 13 of the trigger means 2. As shown at node 4, the "1" signal at the feedback input 13 of the trigger means 2, respectively the "1" signal at the feedback output 14 of the evaluation means 3 and the still pending test signal 8 causes that the safety switch means 5 is switched on again by a "1" signal at its trigger input 10.

At node 5, it is now shown that a change of the control input to "1" and a change of the test input to "0", keep the safety switch means 5 in an on state, wherein both flip-flops 19, 20 for carrying out a further function test are reset, which means that the signals at the release output 23 and the feedback output 14 are set to "0".

FIG. 4c shows a state diagram for the control of the apparatus according to the invention for function monitoring in the embodiment as shown in FIG. 3, during a performance of a function test, in which the safety switching means 5 because of a fault is not switched on again.

First, as described with respect to nodes 1 and 2 in FIG. 4b, a switch off test is carried out. However, this time by a "1" signal at the monitoring input 15 of the evaluation means 3 also after the removal of the signal at the trigger input 10, it is indicated that the safety switch means 5 is not functioning properly, because it is still in a closed state. This can be caused for example by the "bonding" of relay contacts of the safety switch means 5. Because of the absence of a signal change at the monitoring input 15 of the evaluation means 3, flip-flop 19 is not set, thus also no signal change at the function status output 16 of the evaluation means 3 takes place. The micro controller 4 can now initiate a safety-related switch off of the actuator 6.

FIG. 5 shows a timing diagram for the control of the apparatus 1 according to the invention for monitoring the function in the embodiments such as are shown in FIGS. 1 to 3, in faultless operation. In addition to the control input 7, the test input 8 and the function status output 16 for the purpose of clarity FIG. 5 also shows the trigger input 10 and the switching output 11 of the safety switch means 5, the monitoring input 15 of the evaluation means 3 and the signal at the feedback input 13 of the trigger means 2.

In FIG. 5, the implementation of a function test is described. At time $t_0$, the input signal at the control input 7 is set to "1" and the input signal at the test input 8 is set to "0". The signal at the feedback input 13 is at "0". The function status signal on function status output 16 is set to "1" and the safety switch means 5 is closed. The state shown at time $t_0$ of the signals represents the normal operational mode. The connected actuator 6 is supplied with voltage. Via the function status output 16 the software within the control means 4 permanently monitors the normal operation, i.e. it checks the actual value at the safety switch means 5 with respect to deviations from the nominal value at the control input 7.

At time $t_1$, the function test of the safety switch means 5 is being prepared by the software in the control means 4. The preparation is carried out by setting the test input 8 to "1". However, the actual function test will not yet be started. The safety switch means 5 is further driven in accordance with the nominal value at the trigger output 9 of the trigger means 2 and the connected actuator 6 is supplied with voltage.

In the embodiment shown, the preparation causes that the trigger means 2 and the evaluation means 3 because of the realization with flip-flops 19, 20, as shown in FIG. 3, react on the "edges" which are caused by the test procedure described below.

At time $t_2$, the actual function test of the safety switch means 5 is started. The software in the control means 4 switches the nominal value at the control input 7 of the trigger means 2 from "1" to "0" and the trigger means 2 reacts with a switching off of the safety switch means 5 by setting the trigger input 10 of the safety switch means 5 to "0". The evaluation means 3 monitors the output level of the actuator 6 and the safety switch means 5, respectively, by ease of the monitoring input 15.

With a delay that is determined by the voltage variation at the actuator 6, the voltage at the monitoring input 15 drops below a threshold at $t_3$, at which the evaluation means 3 detects a switch off of the actuator 6. The delay is indicated graphically in FIG. 5 with respect to the switching states of the switching output 11 and the monitoring input 15. The evaluation means 3 detects at this time that the safety switch means 5 has been switched off and immediately responds with a "1" signal at the feedback input 13. The signal at the feedback input 13 is provided to the trigger means 2 to thereby initiate the re-switch on closing of the safety switch means 5 by the trigger means 2 by setting the signal at the trigger input 10 of the safety switch means 5 again to "1". At this time, the control input 7 is still at "0".

By re-switching on the actuator 6, it is again supplied with voltage. Since the evaluation means 3 automatically responds to the successful function test and the safety switch means 5 switches on again, the function test for the connected actuator 6 is kept as short as possible.

At time $t_4$ the control means 4 has read the signal at the function status output 16 of the evaluation means 3 and has recognized the successfully carried out function test, and the signal at the control input 7 of the trigger means 2 is set by the control means 4 again from "0" to "1".

The function test of the safety switch means 5 has been successfully completed. The signal at the test input 8 is set by the control means 4 again from "1" to "0". By this, the signal previously issued by the evaluation means 3 at the feedback input 13 is also again set from "1" to "0" and thus deleted.

At time $t_6$, the inputs and outputs have again the same states as before the performance of the function test. The control means 4 controls again the control input 7 of the trigger means 2.

The signals in the timing diagram shown in FIG. 5 and described above for triggering the apparatus 1 according to the inventive for monitoring the function can adopt other logical states at the different times depending on the implementation of logical components. For example, all shown signal states might be inverted.

REFERENCE SIGNS

1 apparatus for monitoring the function
2 trigger means
3 evaluation means
4 control means
5 safety switch means
6 actuator
7 control input
8 test input
9 trigger output
10 trigger input
11 switching output
12 feedback link
13 feedback input
14 feedback output
15 monitoring input
16 function status output
17 control input
18 test input
19, 20 flip-flops
21 AND gate
22 OR gate
23 release output

The invention claimed is:

1. An apparatus for monitoring a function of a safety switch device, wherein the safety switch device comprises: a trigger input and a switch output, the apparatus comprising:
   a trigger circuit with a trigger circuit control input, a test input, a feedback input and a trigger output for connecting to the trigger input of the safety switch device; and
   an evaluation circuit separate from the trigger circuit and including a monitoring input for connecting to the switching output of the safety switch device, a function status output and a feedback output,
   wherein the trigger circuit is adapted to change a first signal at the trigger output depending on a test signal on the test input and a control signal on the control input for a function test of the safety switch device,
   wherein the evaluation circuit is adapted to detect a change of a second signal at the switching output of the safety switch device via the monitoring input to forward a third signal with an information regarding the change via the feedback output of the evaluation circuit to the feedback input of the trigger circuit and to provide a fourth signal with an information regarding the change at the function status output, and
   wherein the trigger circuit is further adapted to immediately reverse a change in the first signal at the trigger output, when during the function test the third signal with information regarding the change of the second signal at the switching output of the safety switch device is received.

2. The apparatus for monitoring the function according to claim 1, wherein the first signal is changed when the third signal with the information regarding the change of the second signal at the switching output of the safety switch device is received at the feedback input of the trigger circuit and wherein the trigger circuit is adapted to keep the first signal changed at the trigger output as long as the test signal at the test input and the third signal at the feedback input of the trigger circuit do not change.

3. The apparatus for monitoring the function according to claim 1, wherein by ease of the change of the first signal at the trigger output, the second signal at the switching output of the safety switch device is changed.

4. The apparatus for monitoring the function according to claim 1, wherein the evaluation circuit comprises the test input.

5. The apparatus for monitoring the function according to claim 4, wherein the third signal with the information regarding the change of the second signal at the switching output is provided to the function status output at least as long as the test signal is present at the test input of the evaluation circuit.

6. The apparatus for monitoring the function according to claim 1, wherein the trigger circuit is adapted to change the signal at the switching output of the safety switch device in reaction to a signal at the control input.

7. The apparatus for monitoring the function according to claim 1, wherein the evaluation circuit comprises an evaluation circuit control input, and wherein the evaluation circuit is adapted to reset the third signal at the feedback output and the fourth signal at the function status output after receiving the second signal with an information regarding the change of the switching output of the safety switch device in reaction of a change of the control signal at the control input.

8. The apparatus for monitoring the function according to claim 1, wherein the trigger circuit and the evolution circuit realize their functions as defined in the claims by hardwired logic.

9. The apparatus for monitoring the function according to claim 1, wherein the trigger circuit is realized by logic gates and the evaluation circuit is realized by flip-flops.

10. The apparatus for monitoring the function according to claim 1, further comprising:
a controller connected to the test input of the trigger circuit and to the function status output of the evaluation circuit.

11. The apparatus for monitoring the function according to claim 9, wherein the controller is adapted to initiate a function test in periodic intervals.

12. The apparatus for monitoring the function according to claim 11, wherein the controller initiates the function test by changing the signal at the test input and the control input of the trigger circuit.

13. The apparatus for monitoring the function according to claim 11, wherein the periodic intervals are between 5 milliseconds and 5 minutes.

14. The apparatus for monitoring the function according to claim 9, wherein the controller comprises a programmable logic.

15. A method for monitoring the function of a safety switch device, which in particular can be used for switching an actuator, the method comprising:
changing a first signal at a trigger output of a trigger circuit, which is connected to a trigger input of the safety switch device dependent upon a test signal at a test input and a control signal on a control input of the trigger circuit;
detecting at an evaluating circuit a change of a second signal at a switching output of the safety switch device;
providing at a function status output of the evaluation circuit a fourth signal with an information regarding the change of the second signal at the switching output of the safety switch device and forwarding a third signal with the information regarding the change to a feedback input of the trigger circuit; and
resetting the first signal at the trigger output of the trigger circuit during a function test dependent upon the reception of the third signal with the information regarding the change.

* * * * *